United States Patent
Byun et al.

[11] Patent Number: 6,096,630
[45] Date of Patent: Aug. 1, 2000

[54] METHOD FOR FABRICATING SEMICONDUCTOR DEVICE

[75] Inventors: Jeong Soo Byun; Byung Hak Lee, both of Chungcheongbuk-do, Rep. of Korea

[73] Assignee: LG Semicon Co., Ltd., Cheongju, Rep. of Korea

[21] Appl. No.: 08/949,397

[22] Filed: Oct. 14, 1997

[30] Foreign Application Priority Data

Sep. 29, 1997 [KR] Rep. of Korea ............. 97/49799

[51] Int. Cl.$^7$ ................. H01L 21/3205; H01L 21/4763
[52] U.S. Cl. ................. 438/592; 438/655; 438/647; 438/683; 438/231; 257/412; 257/413
[58] Field of Search ................. 438/486, 683, 438/588, 592; 257/576, 757, 756, 754, 770, 751, 413

[56] References Cited

U.S. PATENT DOCUMENTS

| | | | |
|---|---|---|---|
| 4,359,490 | 11/1982 | Lehrer | 427/95 |
| 4,443,930 | 4/1984 | Hwang et al. | 29/571 |
| 4,656,157 | 4/1987 | Hofmann et al. | 502/439 |
| 4,684,542 | 8/1987 | Jasinski et al. | 437/225 |
| 4,766,006 | 8/1988 | Gaczi | 427/38 |
| 4,777,150 | 10/1988 | Deneuuille et al. | 437/200 |
| 4,851,295 | 7/1989 | Brors | 428/450 |
| 4,920,908 | 5/1990 | Brors et al. | 427/255.2 |
| 4,966,869 | 10/1990 | Hillman et al. | 437/200 |
| 4,981,723 | 1/1991 | Hirase et al. | 427/255.2 |
| 5,147,829 | 9/1992 | Hench et al. | 501/12 |
| 5,231,056 | 7/1993 | Sandhu | 437/200 |
| 5,268,317 | 12/1993 | Schwalke et al. | 437/41 |
| 5,278,096 | 1/1994 | Lee et al. | 437/162 |
| 5,425,391 | 6/1995 | Thakur et al. | 437/173 |
| 5,500,249 | 3/1996 | Telford et al. | 427/255 |
| 5,558,910 | 9/1996 | Telford et al. | 427/255 |
| 5,571,735 | 11/1996 | Mogami et al. | 438/231 |
| 5,643,633 | 7/1997 | Telford et al. | 427/255 |
| 5,652,183 | 7/1997 | Fujii | 438/621 |
| 5,668,394 | 9/1997 | Lur et al. | 257/413 |
| 5,717,253 | 2/1998 | Shin et al. | 257/754 |
| 5,840,607 | 11/1998 | Yeh et al. | 438/257 |
| 5,882,961 | 3/1999 | Tseng et al. | 438/197 |
| 5,882,962 | 3/1999 | Tseng et al. | 438/197 |

OTHER PUBLICATIONS

T.H. Tom Wu et al.; "Properties of $WSi_x$ using dichlorosilane in a single–water system;" J. Vac. Sci, technol. B6 (6), Nov./Dec. 1988; pp. 1707–1713.

Tohru Hara et al.; "Tungsten Silicide Films Deposited by $SiH_2Cl_2$–$WF_6$ Chemical Reaction;" J. Electrochem. Socl, vol. 136, No. 4, Apr. 1989; pp. 1177–1180.

Tohru Hara et al.; "Composition of Tungsten Silicide Films Deposited by Dichlorosilane Reduction of Tungsten Hexafluoride;" J. Electrochem. Soc., vol. 137, No. 9, Sep. 1990; pp. 2955–2959.

J.T. Hillman, et al.; "Characterization of $WSi_x$ Films Deposited by Reacting $WF_6$ with a Mixture of $SiH_2Cl_2$ and $Si_2H_6$;" J. Electrochem Soc., vol. 139, No. 12, Dec. 1992; pp. 3574–3578.

S.g. Telford, et al.; "Chemically Vapor Deposited Tungsten Silicide Films Using Dichlorosilane in a Single–Wafer Reactor;" J. Electrochem. Soc., vol. 140, No. 12, Dec. 1993; pp. 3689–3701.

*Primary Examiner*—Charles Bowers
*Assistant Examiner*—Hsien-Ming Lee
*Attorney, Agent, or Firm*—Fleshner & Kim, LLP

[57] ABSTRACT

Method for fabricating a semiconductor device, is disclosed, which is suitable for improving a resistivity, including the steps of forming a silicon layer on a substrate, forming a crystalline metal silicide layer on the silicon layer, forming an amorphous metal silicide layer by injecting ions into the crystalline metal silicide layer, and crystallizing the amorphous metal silicide by heat treating the amorphous metal silicide.

13 Claims, 10 Drawing Sheets

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device, of improving a resistivity.

2. Discussion of the Related Art

In general, as the semiconductor devices are highly integrated, a width of wiring in the semiconductor devices is reduced, causing problems, such as drop in operation speed due to consequential increase of a resistance of the wiring. The formation of a thicker wiring as a wiring width is reduced used as a counter measure on the increased sheet resistivity of the wiring causes a problem that a fabrication process for the device becomes complicated with less yield because of a greater step coverage of the wiring. In order to solve these problems, a refractory metal silicide, such as tungsten silicide ($WSi_x$), titanium silicide($TiSi_2$), or cobalt silicide($CoSi_2$) is formed on a polysilicon layer for preventing an increase of resistivity, (hereafter, a refractory metal silicide formed on a polysilicon layer is called "polycide"). However, though this can improve the resistivity and step coverage to a certain extent, an improved method for forming a polycide further is need.

Figure 1A:
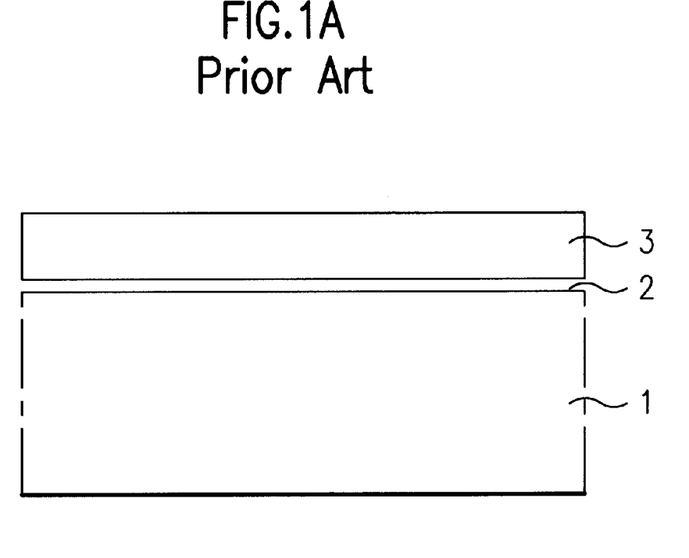
FIGS. 1A–1C illustrate process steps of a first conventional method for fabricating a semiconductor device.
Figure 1B:
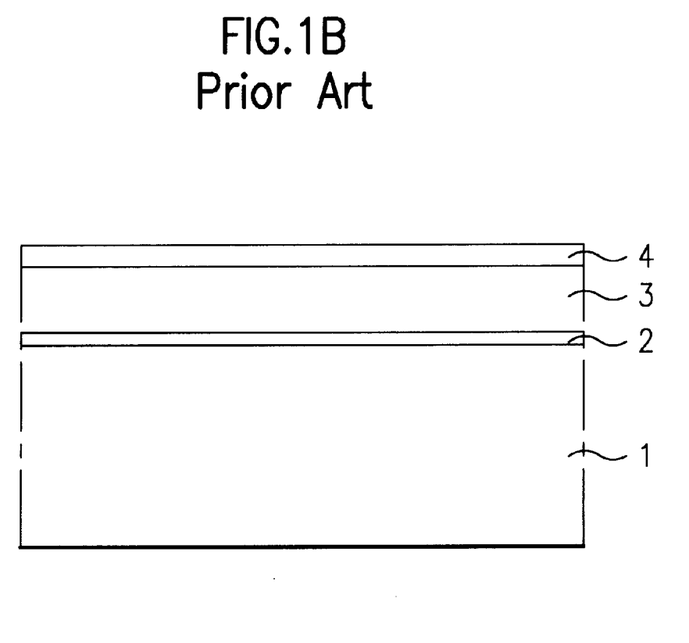
Figure 1C:
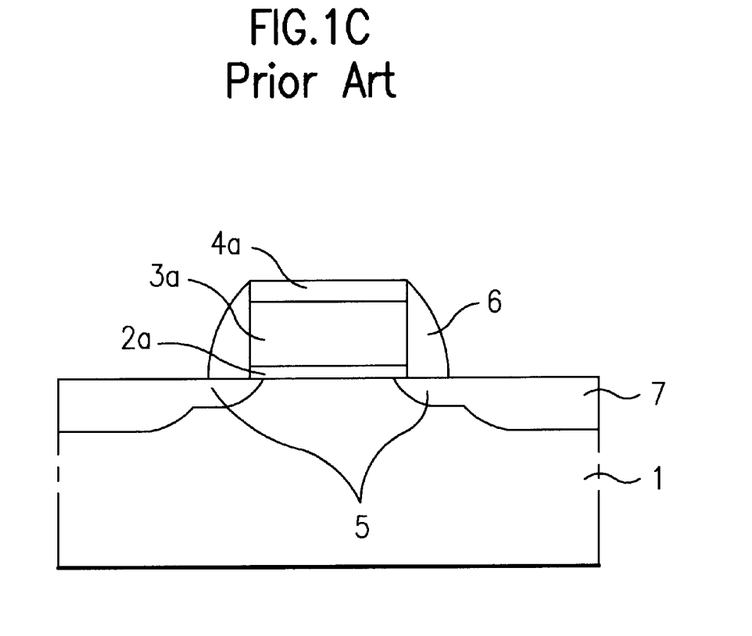
Figure 2A:
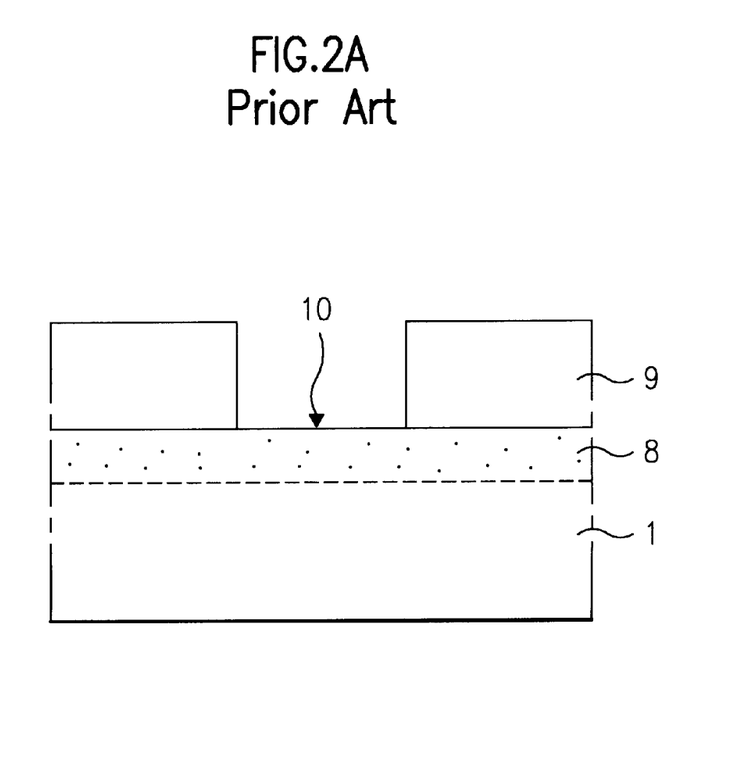
FIGS. 2A–2C illustrate process steps of a second conventional method for fabricating a semiconductor device.
Figure 2B:
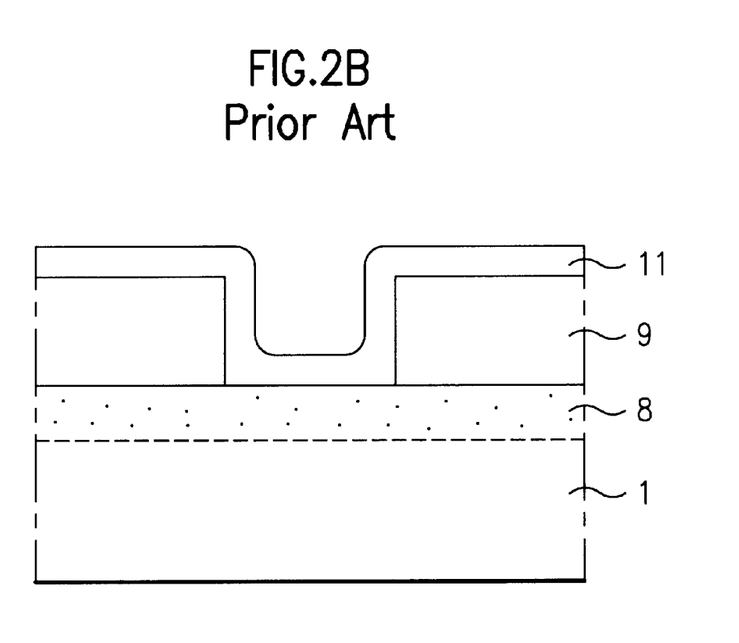
Figure 2C:
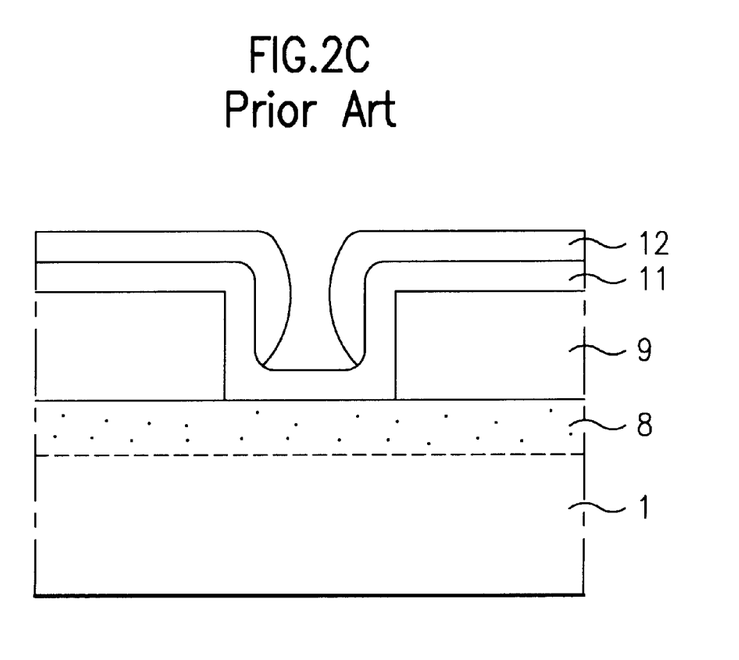

A conventional method for fabricating a semiconductor device will be explained with reference to the attached drawings. FIGS. 1A–1C illustrate process steps of a first conventional method for fabricating a semiconductor device, and FIGS. 2A–2C illustrate process steps of a second conventional method for fabricating a semiconductor device. A polycide fabrication process used for reducing a resistivity and a step coverage in a semiconductor device can be applied to a process for forming a gate electrode or a bitline.

The process steps of the first conventional method for fabricating a semiconductor device in which the polycide fabrication process is applied to formation of a gate electrode will be explained.

Referring to FIG. 1A, the process starts with deposition of a first oxide film 2 on a semiconductor substrate 1 and deposition of a polysilicon layer 3 on the first oxide film 2. The polysilicon layer 3 is doped with P type impurities and soluble in water. The doping of the polysilicon layer 3 may be done by ion injection after deposition of the polysilicon layer 3 is completed, or by deposition of $POCl_3$, or by a continuous injection of a doping gas, such as $PH_3$, while depositing the polysilicon layer. For removing a natural oxide film(or glass) which may remain on the polysilicon layer 3 during the process of forming the polysilicon 3, the process resultant is dipped into HF solution for cleaning. A chemical vapor deposition of $SH_4$ or $SiH_2Cl_2$ with tungsten hexafluoride($WF_6$) gas is conducted to form a tungsten silicide layer 4, to form a polycide layer. As shown in FIG. 1C, the tungsten silicide layer 4, polysilicon layer 3 and the first oxide film 2 are subjected to photolithography to make an anisotropic etching of the layers 2, 3 and 4 with a mask for forming a gate electrode used, resulting to form a stack of a gate cap silicide layer 4a, a gate electrode 3a and a gate oxide film 2a. A lightly doped drain(LDD) region 5 is formed in the semiconductor substrate 1 on each side of the gate electrode 3a. A second oxide film is deposited on the entire surface and subjected to anisotropic etching to remove the second oxide film, forming sidewall insulating films 6 on both sides of the gate cap silicide layer 4a, gate electrode 3a and gate oxide film 2a. Portions of the semiconductor substrate 1 on outward sides of the sidewall insulating films 6, excluding a portion under the gate electrode 3a, are heavily doped, to form source/drain regions 7 therein.

The process steps of the second conventional method for fabricating a semiconductor device in which the polycide fabricating process is applied to formation of a bitline will be explained.

Referring to FIG. 2A, the process steps start with formation of an N type impurity doped layer 8 in a portion of a P type semiconductor substrate 1. A chemical vapor deposition is conducted to form an interlayer insulating layer 9 on the semiconductor substrate 1, which is selectively removed to form a contact hole 10 exposing the N type impurity doped layer 8. As shown in FIG. 2B, a polysilicon layer 11 is formed on the entire surface. The polysilicon layer 11 is doped with P type impurities and soluble in water. The doping of the polysilicon layer 11 may be done by ion injection after deposition of the polysilicon layer 3 is completed, or by deposition of $POCl_3$, or by a continuous injection of a doping gas, such as $PH_3$, while depositing the polysilicon layer. For removing a natural oxide film(or glass) which may remain on the polysilicon layer 11 during the process of forming the polysilicon 11, the process resultant is dipped into HF solution for cleaning. A chemical vapor deposition of $SiH_4$ or $SiH_2Cl_2$ with tungsten hexafluoride($WF_6$) gas is conducted to form a tungsten silicide layer 12 on the polysilicon layer 11, which is subjected to selective patterning to form a bitline of the polycide layer as shown in FIG. 2C.

However, the conventional methods for fabricating a semiconductor device have the following problems.

Because the gate electrode or the bitline in a semiconductor device formed by depositing tungsten silicide on a polysilicon layer according to the conventional methods shows the tungsten silicide to be non-amorphous with small granular sizes, the gate electrode or the bitline has a problem in reducing the resistivity of the polysilicon layer. Due to these reasons, the conventional methods for fabricating a semiconductor device can not serve for reducing the resistivity of the polysilicon in a highly packed device to a size no greater than 0.25 μm.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method for fabricating a semiconductor device which is suitable for improving a resistivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of forming a silicon layer on a substrate, forming a crystalline metal silicide layer on the silicon layer, forming an amorphous metal silicide layer by injecting ions into the crystalline metal silicide layer, and crystallizing the amorphous metal silicide by heat treating the amorphous metal silicide.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate preferred embodiments of the invention and together with the description serve to explain the principles of the invention.

DETAILED DESCRIPTION OF THE PREFERRED EMBODIMENT

Figure 3A:
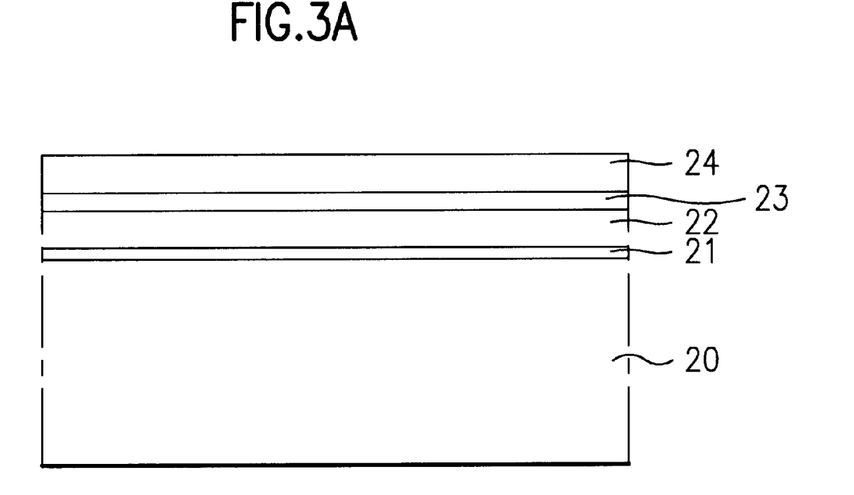
FIGS. 3A–3C illustrate process steps of a method for fabricating a semiconductor device in accordance with a first preferred embodiment of the present invention.
Figure 3B:
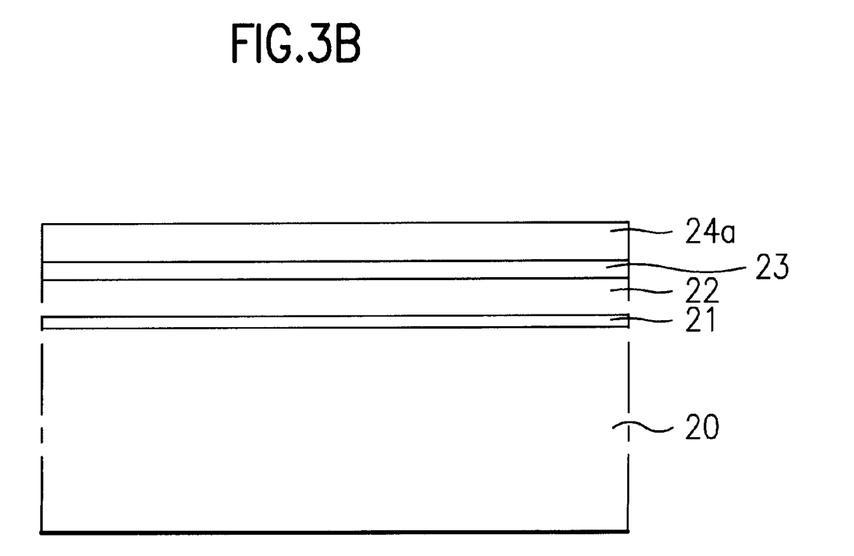
Figure 3C:
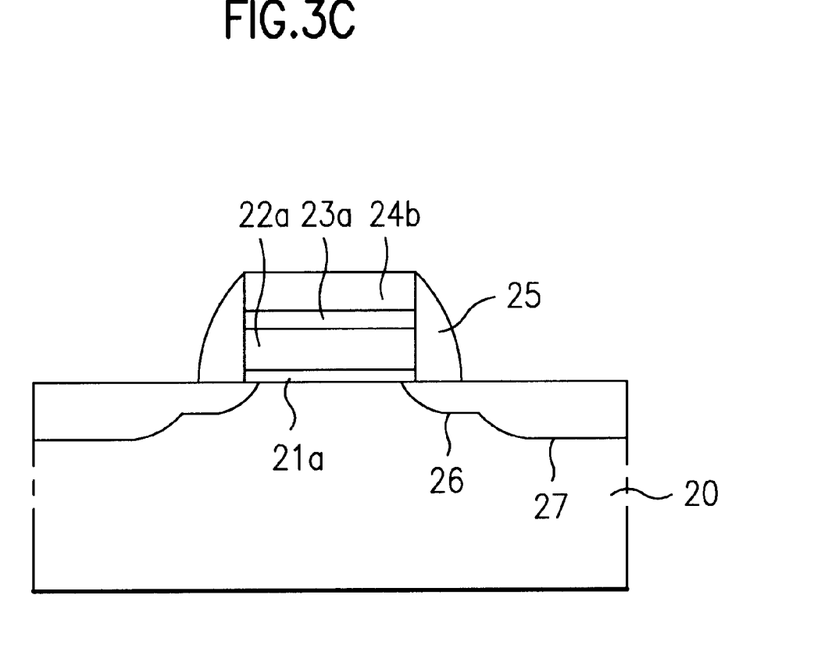

Reference will now be made in detail to the preferred embodiments of the present invention, examples of which are illustrated in the accompanying drawings. FIGS. 3A–3C illustrate process steps of a method for fabricating a semiconductor device in which a refractory metal silicide is formed in accordance with a first preferred embodiment of the present invention, and FIGS. illustrate process steps of a method for fabricating a semiconductor device in accordance with a second preferred embodiment of the present invention.

A polycide fabricating process used for reducing a resistivity of a semiconductor device can be applied to formation of a gate electrode or a bitline. An example in which the polycide fabricating process is applied to formation of a gate electrode according to the present invention will be explained.

Referring to FIG. 3A, the process steps of the method for fabricating a semiconductor device in accordance with a first preferred embodiment of the present invention starts with depositing a first oxide film 21 on a semiconductor substrate 20, on which a doped polysilicon layer 22 is deposited to a thickness of 1000 Å at 660 deg. C and 80 Torr using an ICT(Integrated Cluster Tool). Then, an undoped polysilicon layer 23 is deposited on the doped polysilicon layer 22 to a thickness about 200 Å. In the deposition of the doped polysilicon layer 22, $H_2$ mixed with 50% $SiH_4$ and 1% $PH_3$ is used as a source gas. A tungsten silicide layer 24 is formed on the undoped polysilicon layer 23 using $WF_6$ and $SiH_2Cl_2$ or $WF_6$ and $SiH_4$ as source gases. The doped polysilicon layer 22 and the undoped polysilicon layer 23 are layered under the tungsten silicide layer 24, for preventing loss of ions injected into the tungsten silicide layer at converting the tungsten silicide layer 24 into an amorphous tungsten silicide layer by injecting the ions thereto at a later step. The doped polysilicon layer 22 may be deposited to a thickness of about 800 Å, the undoped polysilicon layer 23 may be deposited to a thickness of about 200 Å, and the tungsten silicide layer 24 may be deposited to a thickness of about 1000 Å. Alternatively, the doped polysilicon layer 22 may be deposited to a thickness of about 300 Å, the undoped polysilicon layer 23 may be deposited to a thickness of about 200 Å, and the tungsten silicide layer 24 may be deposited to a thickness of about 2000 Å. The tungsten silicide layer 24 may be formed to have a thickness in a range of 1000 Å~2000 Å, As shown in FIG. 3B, N type phosphorus ions are injected into the tungsten silicide layer 24 at an energy of 80 KeV to a dose of $1\times10^{15}$~$8\times10^{15}$ cm$^{-3}$, to convert the tungsten silicide layer 24 into amorphous. Preferably, the energy injecting the phosphorus ions may be 80 KeV. Heat treatment is conducted at about 900 deg. C for approx. 30 minutes to recrystallize the amorphous tungsten silicide layer 24, to form a large grain sized tungsten silicide 24a. The heat treatment may be conducted at a temperature in a range of 400~1100 deg. C. Alternatively, instead of the N type phosphorus ions, P type arsenic ions(As) or boron(B) ions may be injected at 70 KeV or 20 KeV respectively to a dose of $1\times10^{15}$~$8\times10^{15}$ cm$^{-3}$, to form the large grain sized tungsten silicide 24a through the heat treatment. As shown in FIG. 3C, in order to form a gate electrode, a mask is used in an anisotropic etching the stack of the first oxide film, doped polysilicon layer 22, undoped polysilicon layer 23, large grain sized tungsten silicide layer 24a, to form a gate cap silicide layer 24b, the gate electrode 22a and 23a and gate oxide film 21a. LDD(Lightly Doped Drain) regions 26 are formed in the semiconductor substrate 20 on both sides of the gate electrode 22a and 23a, on the entire surface of which a second oxide film is deposited and subjected to anisotropic etching to remove the second oxide film selectively, to form sidewall spacers 25 at sides of the gate cap silicide layer 24b, the gate electrode 23a and 22a and the gate oxide film 21a. Then, portions of the semiconductor substrate 21 on both sides of the sidewall spacers 25 excluding the gate electrode 22a and 23a are heavily doped to form source/drain regions 27. The tungsten silicide layer 24 may be deposited after deposition and HF cleaning of the doped polysilicon layer.

Figure 5:
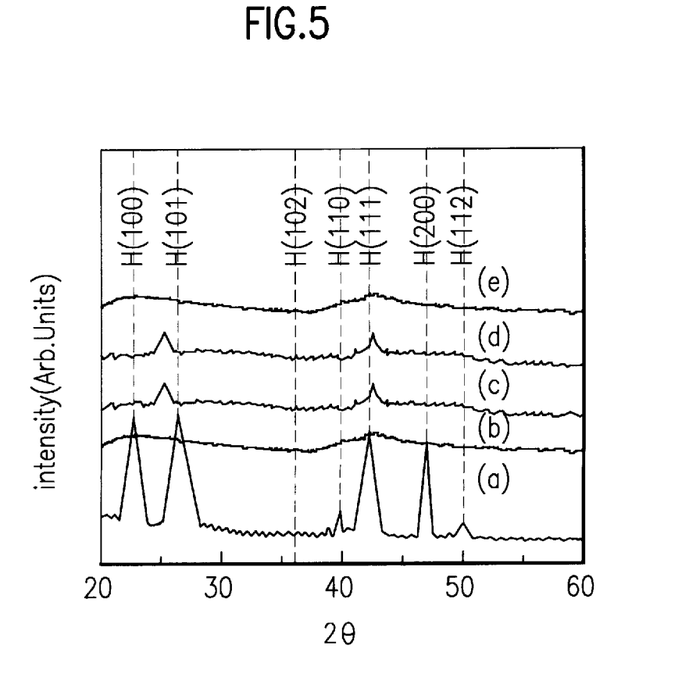
FIG. 5 illustrates a graph showing an amorphous property of the doped tungsten silicide layer of the present invention.
Figure 6:
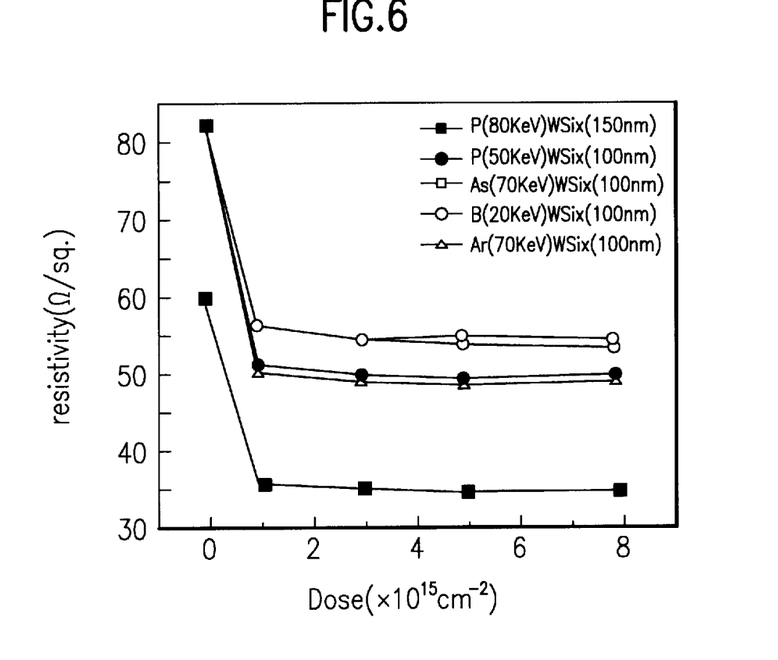
FIG. 6 illustrates a graph showing ion dose vs. resistivity of the tungsten silicide layer of the present invention.
Figure 7:
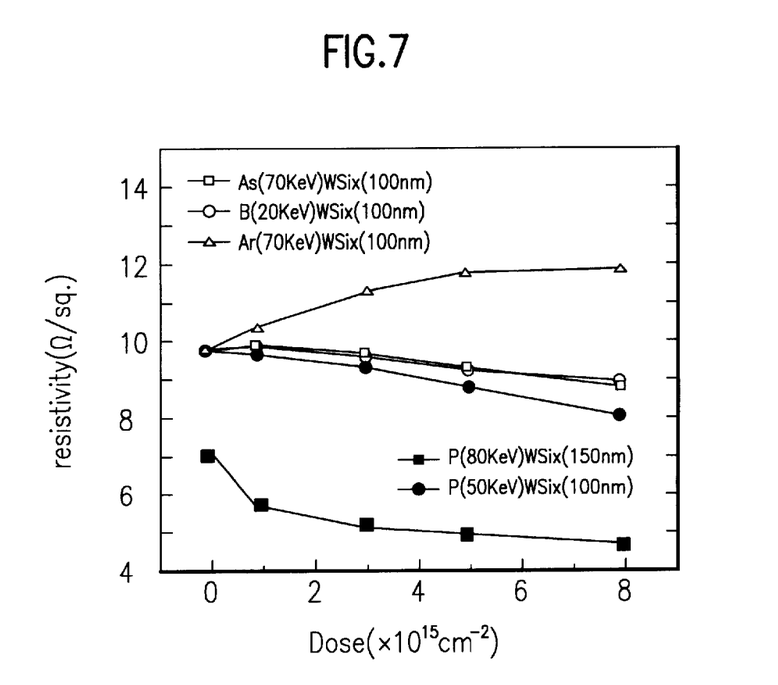
FIG. 7 illustrates a graph showing ion dose vs. resistivity of the tungsten silicide layer of the present invention after subjecting to heat treatment at 900 deg. C for 30 minutes.
Figure 8:
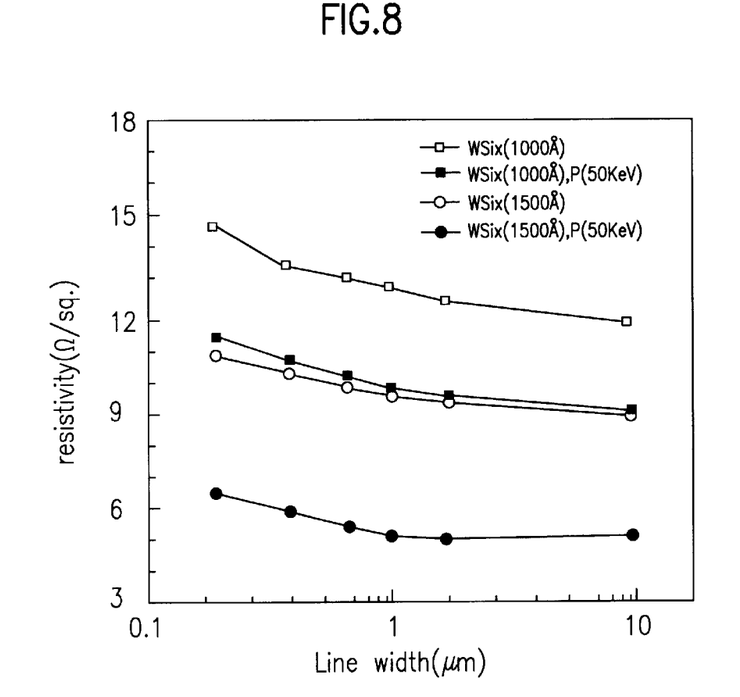
FIG. 8 illustrates a graph showing line width vs. resistivity of the tungsten silicide layers of different thicknesses of the present invention when P ion is used as dopant.
Figure 9:
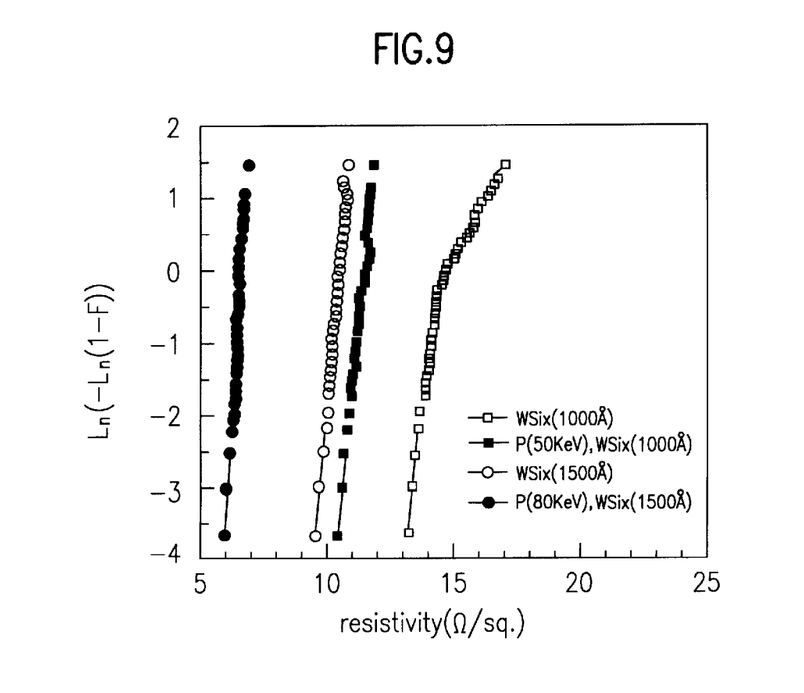
FIG. 9 illustrates a graph showing resistivity of a gate electrode of a 0.25 $\mu$m line width formed under conditions described for FIG. 8.

Amorphous phases of the 1000 Å thick tungsten silicide layer 24 when it is ion injected at a dose of $5\times10^{15}$ cm$^{-3}$ will be explained. FIG. 5 illustrates plots of XRD(X-ray diffraction) analysis data of the tungsten silicide layer 24 when different ions are injected thereinto, wherein (a) is in the case of no ion injection, (b) is in the case of phosphorus (P) ion injection, (c) is in the case of boron(B) ion injection, (d) is in the case of arsenic ion injection, and (e) is argon ion injection, respectively. From the fact that X-rays appear more intensive when 2Θ (angle) of the tungsten silicide layer are 30 deg. and approx. 40 deg., it can be known that the X-rays are diffracted at those angles where the tungsten silicide has a crystal orientation of (111), which implies that the tungsten silicide layer is crystalline. Further, it can be known that the tungsten silicide layers 24 have been completely converted into amorphous phases in the cases of argon(Ar) and phosphorus(P), but the tungsten silicide layers 24 have not been completely converted into amorphous phases in the cases of boron(B) and arsenic(As). As shown in FIG. 6, when the dose is made differently, resistivity of the tungsten silicide layer 24 is sharply reduced in all the cases if the dose is over $1 \times 10^{15}$ cm$^{-3}$, and even in the cases when the dose is kept increased, the resistivity is reduced gradually, which implies that almost all portions of the tungsten silicide layer 24 is converted into amorphous phase at a dose of $1 \times 10^{15}$ cm$^{-3}$. As shown in FIG. 7, dose vs. resistivity of the tungsten silicide layer 24, doped and heat treated at 900 deg. C. for 30 minutes, shows decrease of the resistivity as the dose increases in the cases of arsenic (As), boron (B), and phosphorus(P) ions, exhibiting the maximum extent of reduction at an injection energy of 80 KeV in the case of phosphorus(P) ions, but formation of a compound in the cases of arsenic (As) and boron(B) ion injections. On the other hand, in the case of argon ion injection, the resistivity is increased as the dose is increased because the argon(Ar), an inactive gas, decomposes in the process of the heat treatment, to form voids therein. From examination of these data, it can be known that phosphorus(P) ion injection at a dose over $5 \times 10^{15}$ cm$^{-3}$ is preferable. Next, as shown in FIGS. 8 and 9, if resistivities of the gate electrode 22a and 23a are compared in the cases of the tungsten silicide layer which is deposited to an 1000 Å thickness and injected of phosphorus(P) ions at 50 KeV, and deposited to an 1500 Å thickness and injected of phosphorus(P) ions at 80 KeV, and in the case when a minimum line width of the gate electrode 22a and 23a is set to be 0.25 µm while the other conditions are remained the same as the above, the resistivity in the case of the tungsten silicide deposited to an 1500 Å thickness and injected of phosphorus(P) ions at 80 KeV is the lowest.

A method for fabricating a semiconductor device in accordance with a second embodiment of the present invention will be explained. This second embodiment of the present invention is applicable to a case when the amorphous tungsten silicide layer formed in accordance with the first embodiment is used in formation of a CMOS transistor having a dual gate.

Figure 4A:
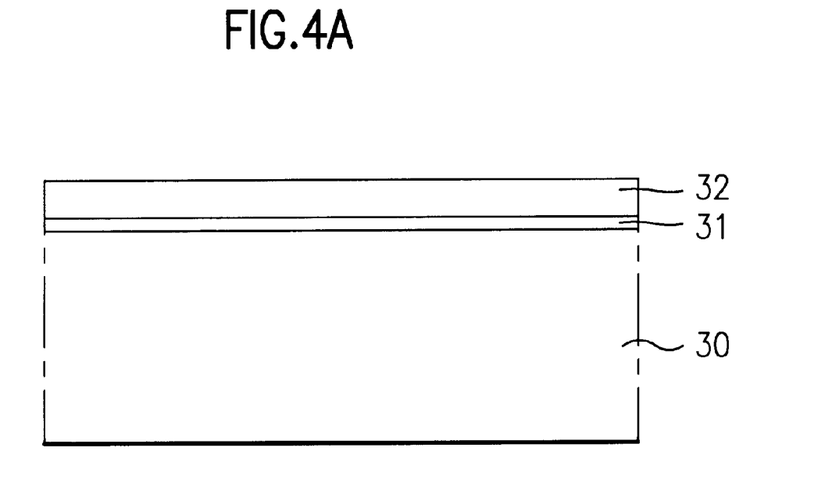
FIGS. 4A–4F illustrate process steps of a method for fabricating a semiconductor device in accordance with a second preferred embodiment of the present invention.
Figure 4B:
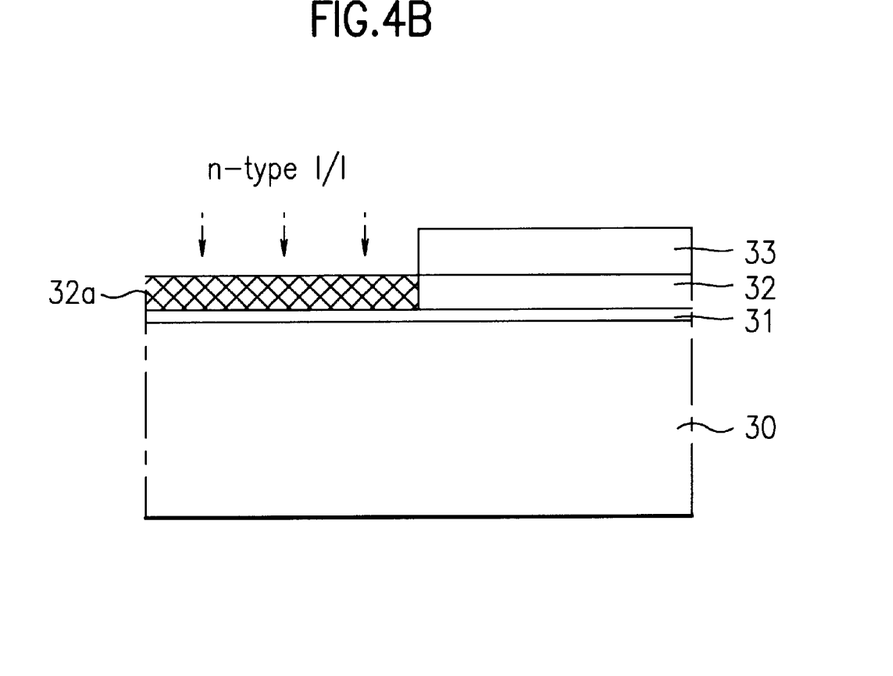
Figure 4C:
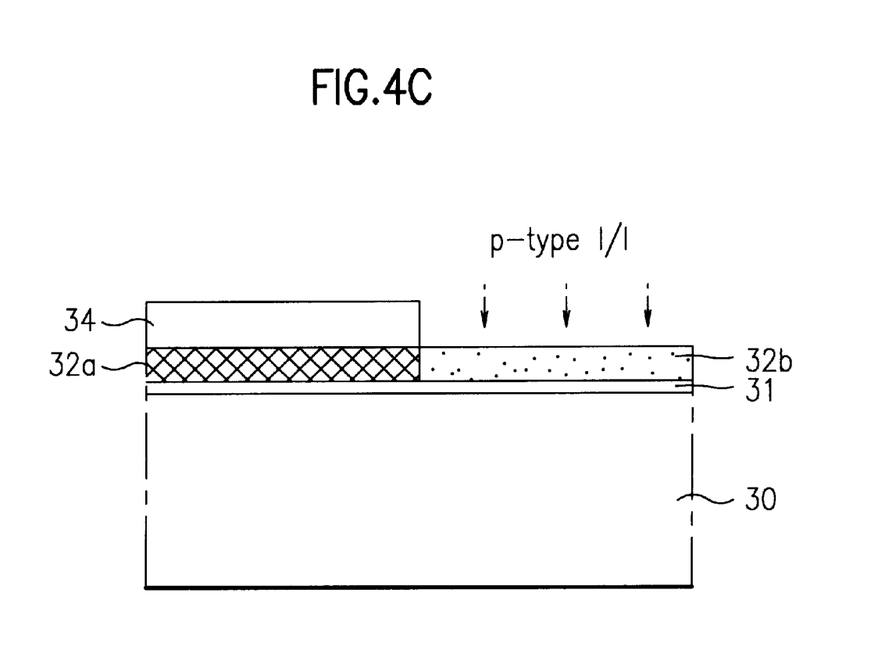
Figure 4D:
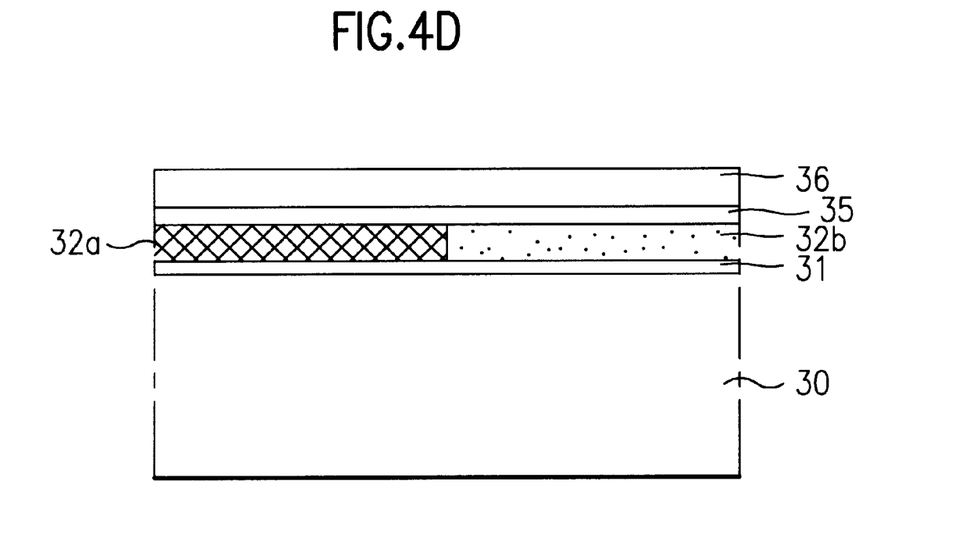
Figure 4E:
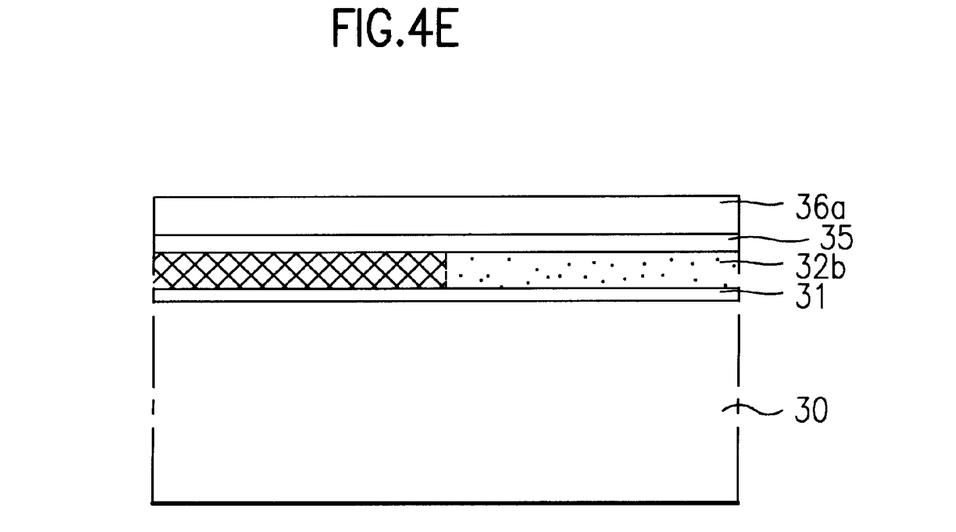
Figure 4F:
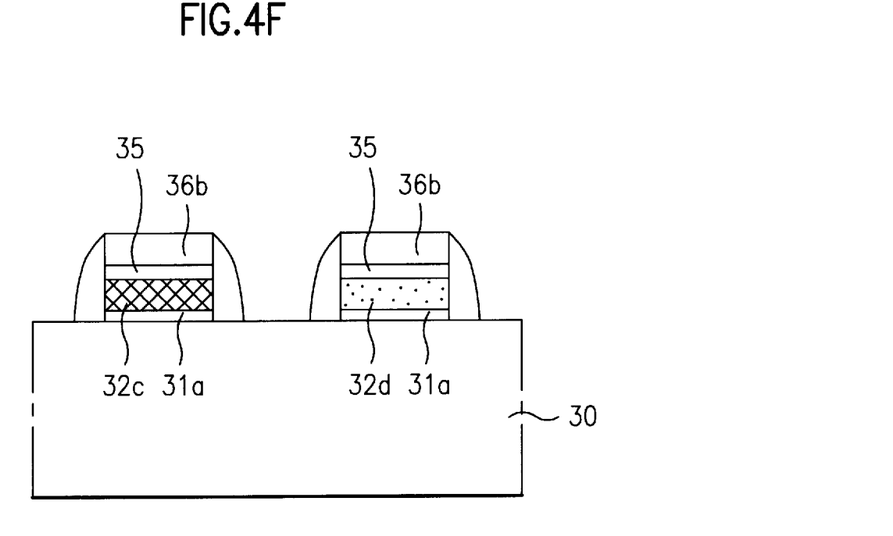

Referring to FIG. 4A, the method for fabricating a semiconductor device in accordance with the second embodiment of the present invention starts with depositing a first oxide film 31 on a semiconductor substrate 30 to a thickness of 50 Å, on which undoped polysilicon layer 32 is deposited to a thickness of about 1000 Å. As shown in FIG. 4B, a first photoresist film 33 is coated on the undoped polysilicon layer 32 and subjected to selective patterning to expose a portion of the undoped polysilicon layer 32 in which an NMOS transistor is to be formed. The patterned photoresist film 33 is used as a mask in injecting N type phosphorus(P) ions into the portion of the undoped polysilicon layer 32, to form an N type polysilicon layer 32a. As shown in FIG. 4C, the first photoresist film 33 is removed, and a second photoresist film 34 is coated and subjected to exposure and development for selective patterning of the second photoresist film 34, to expose a portion of the undoped polysilicon layer 32 at a side of the N type polysilicon layer 32a in which a PMOS transistor is to be formed. P type arsenic(As) or boron(B) ions are injected into the exposed portion of the undoped polysilicon layer 32, to form a P type polysilicon layer 32b. Then, the second photoresist film 34 is removed. As shown in FIG. 4D, a titanium nitride(TiN) is deposited both on the N type polysilicon layer 32a and the P type polysilicon layer 32b to a thickness of about 100 Å, to form a diffusion preventing film 35. In the deposition of the 100 Å titanium nitride, a 50 Å of titanium nitride is deposited after deposition of a 50 Å of titanium nitride so that grain boundaries of the two films are not matched, to improve a diffusion preventing capability. Instead of the titanium nitride(TiN), tungsten nitride(WNx), tungsten silicon nitride (WSiN), tantalum silicon nitride(TaSiN), or the like may be deposited as the diffusion preventing film 35. Then, a tungsten silicide layer 36 is formed on the diffusion preventing film 35 to a thickness ranging 1000 Å~2000 Å using WF$_6$ and SiH$_2$Cl$_2$ or WF$_6$ and SiH$_4$ as source gases. The tungsten silicide layer 36 is formed after formation of the diffusion preventing film 35, for forming the dual gate which will not give influences to the dual gated CMOS device having a gate cap silicide layer 36b formed with the large grain sized tungsten silicide layer 36a in a later step. As shown in FIG. 4E, N type phosphorus(P) ions are injected into the tungsten silicide layer 36 at an energy of 80 KeV to a dose in a range of $1 \times 10^{15}$~$8 \times 10^{15}$ cm$^{-3}$, and, preferably, of more than $5 \times 10^{15}$ cm$^{-3}$, to convert the tungsten silicide into amorphous, which is subjected to heat treatment at about 900 deg. C for about 30 minutes, to recrystallize the tungsten silicide to form a large grain sized tungsten silicide layer 36a. In this instance, the heat treatment may be conducted at a temperature in a range of 400~1100 deg. C. The large grain sized tungsten silicide layer 36a may be formed through a heat treatment process after injecting P type arsenic(As) or boron(B) ions at 70 KeV or 20 KeV respectively to the same doses as the above. As shown in FIG. 4F, a mask for forming a gate electrode of an NMOS transistor is used in an anisotropic etching of a stack of the first oxide film 31, the N type polysilicon layer 32a, and the large grain sized tungsten silicide layer 36a, to form a gate cap silicide layer 36b, a first gate electrode 32c and a gate oxide film 31a. And, a mask for forming a gate electrode of a PMOS transistor is used in an anisotropic etching of a stack of the first oxide film 31, the P type polysilicon layer 32b, and the large grain sized tungsten silicide layer 36a, to form a gate cap silicide layer 36b, a second gate electrode 32d and a gate oxide film 31a. The large grain sized tungsten silicide layer 36a may be formed by sputtering a WSi$_{2.2}$ forming target to form an amorphous tungsten silicide layer after formation of the diffusion preventing film 35 and heat treating the amorphous tungsten silicide layer at 900 deg. C without ion injection.

In the first, or second embodiment, the tungsten silicide layer may be replaced with a titanium silicide layer or a tantalum silicide layer, which are refractory metal silicides. In the case of formation of the titanium silicide layer, TiCl$_4$, TiI$_2$, SiH$_4$, or SiH$_2$Cl$_2$ may be used as a source gas to form TiSi$_2$, and, in the case of formation of the tantalum silicide layer, TaCl$_5$, SiH$_4$, or SiH$_2$Cl$_2$ may be used as a source gas to form TaSi$_2$.

The method for fabricating a semiconductor device of the present invention as explained has the following advantages.

First, the reduction in a resistivity of a gate electrode by forming a large grain sized silicide layer on the gate electrode by means of recrystallization allows an improvement of device performance.

Second, the diffusion preventing film formed on N type and P type doped polysilicon layers permits to improve a reliability of a dual gate device.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:

(1) forming a silicon layer on a substrate, (2) forming a crystalline metal silicide layer on the silicon layer;

(3) forming an amorphous metal silicide layer by injecting ions into the crystalline metal silicide layer, wherein the crystalline metal silicide layer is converted to be amorphous by injecting ions of phosphorus(P), boron(B), or arsenic(As), wherein a dose of the ions of phosphorus (P), born(B), or arsenic(As) is in a range of about 1E15~8E15 cm$^{-3}$;

(4) crystallizing the amorphous metal silicide by heat treating the amorphous metal silicide; and (5) forming a diffusion preventing film on the silicon layer, wherein the diffusion preventing film is formed by first and second deposition steps of about 50 Å in each deposition step to form first and second diffusion preventing films, respectively so that grain boundaries of the first and second diffusion preventing films do not match whereby a diffusion preventing property is increased.

2. The method of claim 1, wherein the step (1) includes the steps of, depositing a doped silicon layer, and cleaning the doped silicon layer with HF solution.

3. The method of claim 1, wherein the crystalline metal silicide layer includes one of tungsten, titanium, and tantalum.

4. The method of claim 3, wherein the crystalline metal silicide layer is formed of tungsten using $WF_6$ and $SiH_4$, or $WF_6$ and $SiH_2Cl_2$ as source gases.

5. The method of claim 1, wherein the crystalline metal silicide layer has a thickness range of about 1000 Å~2000 Å.

6. The method of claim 1, wherein the heat treating of the amorphous metal silicide is conducted at a temperature ranging about 400~1100 deg. C.

7. A method for fabricating a semiconductor device, comprising the steps of:

(1) depositing an insulating film on a substrate;

(2) forming a first conductive type polysilicon layer on a first region of the insulating film;

(3) forming a second conductive type polysilicon layer on a second region of the insulating film;

(4) forming a diffusion preventing film on the first and second conductive polysilicon layers, wherein the diffusion preventing film is formed with first and second deposition steps of about 50 Å in each deposition step to form first and second diffusion preventing films, respectively, so that grain boundaries of the first and second diffusion preventing films do not match whereby a diffusion preventing property is increased;

(5) forming an amorphous metal silicide layer, wherein the step (5) for forming an amorphous metal silicide layer consists of the step of sputtering an amorphous metal silicide layer on the diffusion preventing film;

(6) crystallizing the amorphous metal silicide layer by heat treating the amorphous metal silicide layer; and (7) etching the crystallized metal silicide layer, the first and second polysilicon layers, and the insulating film to form a CMOS transistor.

8. The method of claim 7, wherein the diffusion preventing film is one of titanium nitride (TiN), tungsten nitride (WNx), tungsten silicon nitride (WSiN), and tantalum silicon nitride (TaSiN).

9. The method of claim 7, wherein the crystalline metal silicide layer includes one of tungsten (W), titanium (Ti), and tantalum (Ta).

10. The method of claim 7, wherein the heat treating of the amorphous metal silicide is conducted at a temperature range of about 400~1100 deg. C.

11. A method of making a semiconductor device comprising:

forming a semiconductor layer;

forming an amorphous compound layer having metal and semiconductor atoms, wherein the step of forming the amorphous compound layer comprises sputtering on the semiconductor layer the amorphous compound layer;

converting the amorphous compound layer to a crystalline compound layer having metal and semiconductor atoms; and forming a diffusion preventing film on the semiconductor layer, wherein the diffusion preventing film is formed by first and second deposition steps of about 50 Å in each deposition step to form first and second diffusion preventing films, respectively, so that grain boundaries of the first and second diffusion preventing films do not match whereby a diffusion preventing property is increased.

12. The method of claim 11, wherein the step for forming the semiconductor layer comprises:

forming a doped silicon layer; and forming an undoped silicon layer on the doped silicon layer.

13. The method of claim 11, wherein the semiconductor atoms comprises silicon, and the metal atoms comprises one of tungsten, titanium and tantalum.

* * * * *